(12) United States Patent
Wyss et al.

(10) Patent No.: US 10,530,139 B2
(45) Date of Patent: Jan. 7, 2020

(54) HOUSING WITH A SEALING BODY, A SEALING BODY FOR THE HOUSING AND A METHOD FOR PRODUCING THE SEALING BODY

(71) Applicant: GWF MESSSYSTEME AG, Lucerne (CH)

(72) Inventors: Jörg Wyss, Lucerne (CH); Ralph Kayser, Lucerne (CH); Samuel Hubacher, Madiswil (CH); Walter Furrer, Malters (CH); Thomas Frey, Küssnacht am Rigi (CH)

(73) Assignee: GWF Messsysteme AG, Lucerne (CH)

( * ) Notice: Subject to any disclaimer, the term of this patent is extended or adjusted under 35 U.S.C. 154(b) by 336 days.

(21) Appl. No.: 15/328,924

(22) PCT Filed: Jul. 29, 2015

(86) PCT No.: PCT/EP2015/067440
§ 371 (c)(1),
(2) Date: Jan. 25, 2017

(87) PCT Pub. No.: WO2016/016342
PCT Pub. Date: Feb. 4, 2016

(65) Prior Publication Data
US 2017/0214233 A1   Jul. 27, 2017

(30) Foreign Application Priority Data
Jul. 29, 2014   (EP) .................................. 14178982

(51) Int. Cl.
*H02G 3/08* (2006.01)
*H02G 15/013* (2006.01)
(Continued)

(52) U.S. Cl.
CPC ............... *H02G 3/088* (2013.01); *G01F 1/05* (2013.01); *G01F 15/14* (2013.01); *H02G 15/013* (2013.01); *H05K 5/0247* (2013.01); *H05K 5/069* (2013.01)

(58) Field of Classification Search
CPC ...... G01F 15/14; H02G 3/088; H02G 15/013; G01D 11/24; G01D 11/245; G01D 11/26; F16J 15/064
See application file for complete search history.

(56) References Cited

U.S. PATENT DOCUMENTS 5,247,424 A * 9/1993 Harris ................ H01R 13/5202
174/547
6,302,980 B1 * 10/2001 Kortenbach ........... H01B 7/285
156/48

(Continued)

FOREIGN PATENT DOCUMENTS

CN     101505999 A     8/2009
CN     101569065 A    10/2009
(Continued)

*Primary Examiner* — Justin N Olamit
(74) *Attorney, Agent, or Firm* — William J. Clemens; Shumaker, Loop & Kendrick, LLP

(57) ABSTRACT

A housing for measuring instruments has a sealing element with conductor guides for guiding insulated conductors therethrough. The sealing element is prefabricated. The conductor ends of the conductors are at least partly stripped. A transition point between the insulated conductor and the partly stripped conductor end is located in the conductor guide within the sealing element.

15 Claims, 2 Drawing Sheets

(51) Int. Cl.
*G01F 1/05* (2006.01)
*G01F 15/14* (2006.01)
*H05K 5/02* (2006.01)
*H05K 5/06* (2006.01)

(56) References Cited

U.S. PATENT DOCUMENTS

| | | | | |
|---|---|---|---|---|
| 6,928,728 B2 * | 8/2005 | Walding, Jr. | ............ | F16J 15/14 |
| | | | | 174/564 |
| 7,863,519 B2 * | 1/2011 | Steinich | ............... | G01D 11/245 |
| | | | | 174/50 |
| 9,513,180 B2 * | 12/2016 | Rowe | .................. | A61M 16/044 |
| 2004/0025337 A1 | 2/2004 | Walding, Jr. et al. | | |
| 2013/0032395 A1 * | 2/2013 | Smoll | ...................... | H01R 4/70 |
| | | | | 174/84 R |

FOREIGN PATENT DOCUMENTS

| | | |
|---|---|---|
| DE | 7202008 U | 4/1972 |
| DE | 8109316 U | 8/1981 |
| EP | 2706620 A1 | 3/2014 |
| GB | 2317273 A | 3/1998 |

* cited by examiner

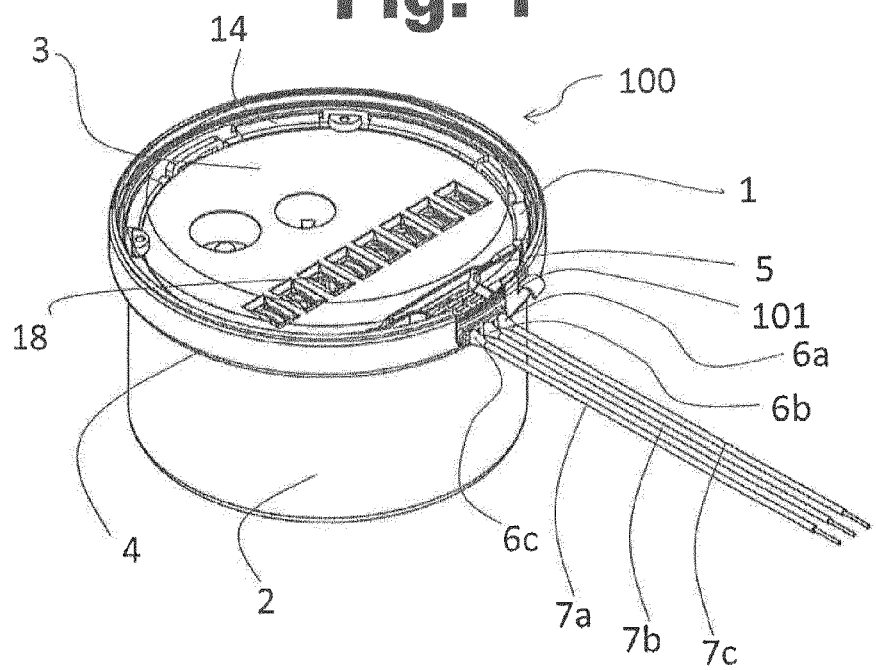
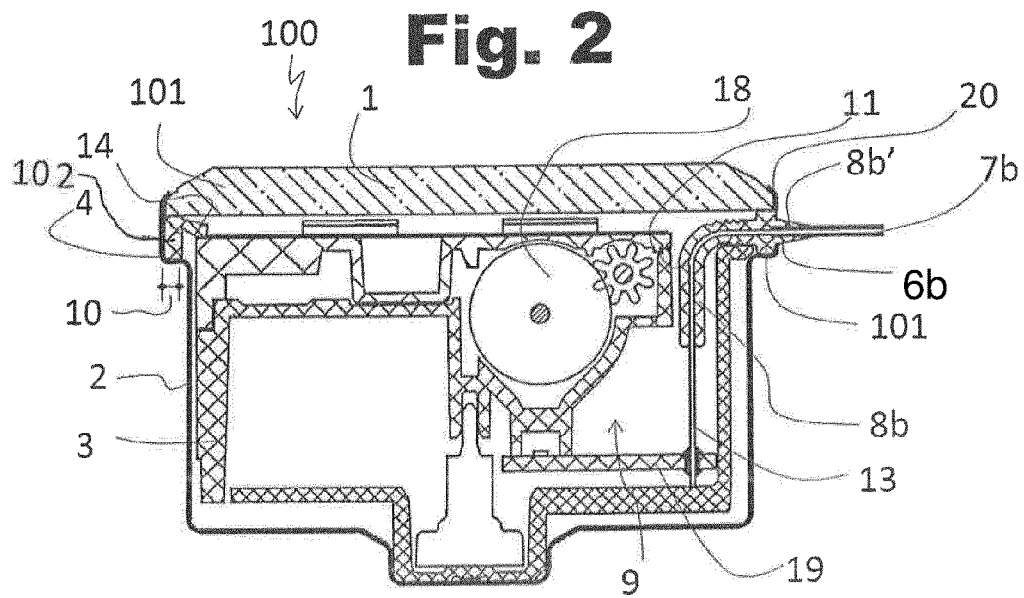

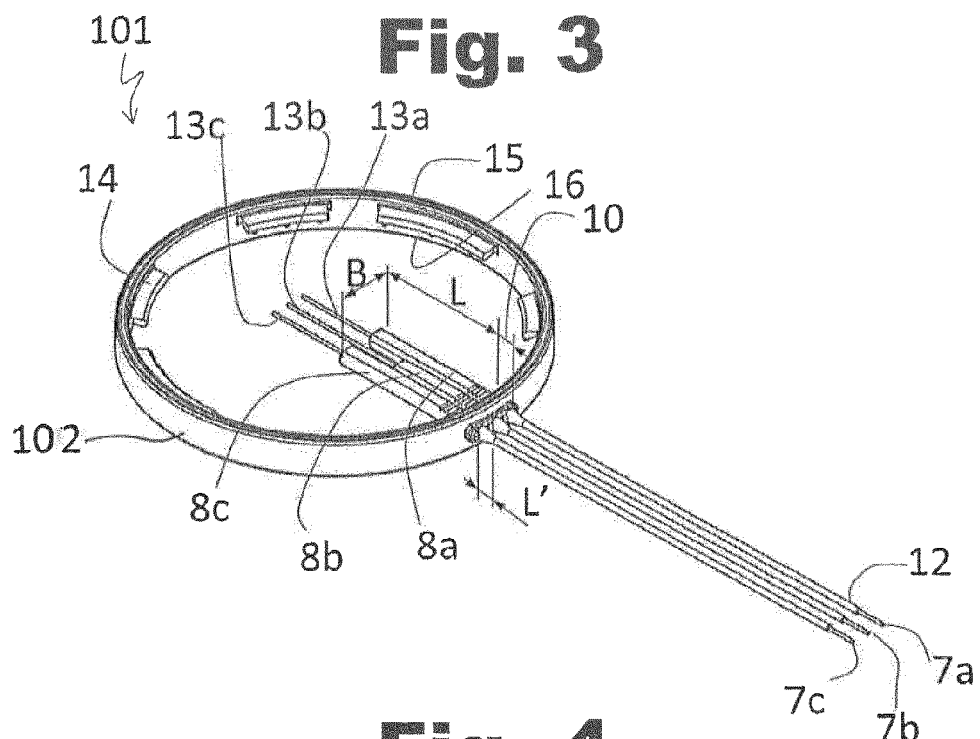
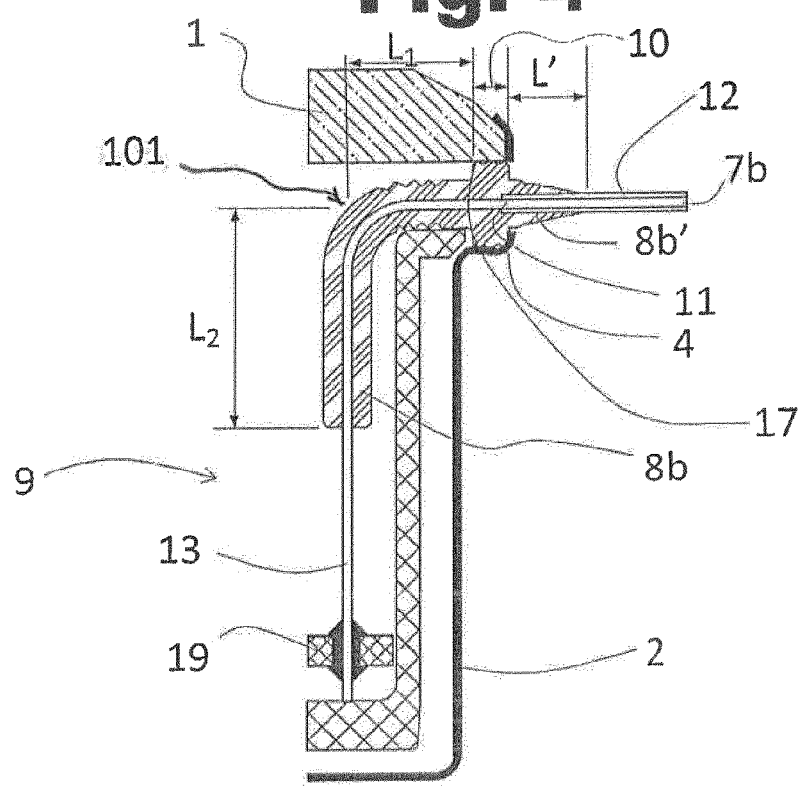

HOUSING WITH A SEALING BODY, A SEALING BODY FOR THE HOUSING AND A METHOD FOR PRODUCING THE SEALING BODY

FIELD

The invention relates to a housing with a sealing body, to a sealing body for the housing and to a method for producing the sealing body.

BACKGROUND

Such sealing bodies are typically used in housings with an interior space for measuring instruments. Measuring instruments are, for example, water meters, gas meters or electricity meters. Since such measuring instruments are frequently used outside and increasingly also underground, the housings have to be constructed so that the measuring devices of the measuring instruments are protected from moisture and dust. In that case, particular attention has to be given to the areas of the housing provided for leading electrical lines from the environment through into the interior of the housing.

It is known to integrate such leadthroughs in the seal of a housing for better protection against ingressing water. For example, a leadthrough has been made known by GB 2 317 273 A in which, for additional sealing, the lines were encapsulated in an epoxy adhesive. Prior to encapsulation, the lines are mounted in a rubber plug so that when the epoxy adhesive is filled into a part of the housing provided for that purpose and after hardening of the adhesive a sealed, firmly closed housing is created. However, this form of leadthrough has the disadvantage that it is expensive to produce and several individual components are necessary for sealing. In addition, when sealing is carried out specific hardening times and temperatures have to be observed.

SUMMARY

It is therefore an object of the invention to overcome the disadvantages of the prior art. In particular, it is an object of the invention to provide a sealing body, which is economic to produce, with a line guide for leading through a line and a method of producing such a sealing body. A further object of the invention is to provide an economic and reliably watertight housing for measuring instruments.

The invention relates to a housing for measuring instruments, particularly for water meters, comprising a housing base and a closure body for closing the housing as well as a prefabricated sealing body, which is or can be sealingly arranged between the housing base and the closure body. The sealing body can be installed between the housing base and the closure body and—after assembly of the housing—sealingly arranged, without a material couple, between the housing base and the closure body and can be removed again from the housing without destruction. The sealing body has a line guide for leading through a line, wherein the line has electrical insulation, preferably an electrically insulating casing, and at least one line end. The line end is at least partly stripped and a transition point from the insulated line to the stripped line end (or to the stripped line of the line end) is arranged in the line guide. Such an arrangement enables, for example, particularly secure connection of a measuring instrument, preferably a water meter, wherein energy and/or signal transmission is possible without loss of tightness. In addition, assembly of the housing is simple.

The housing can comprise, for formation of a closed sealing body, a sealing body with an annular sealing section. If the separation point between housing base and closure body lies in a plane, the annular sealing section can overall be of flat construction and lie in a plane. However, the annular sealing section can—notwithstanding the overall flat configuration—have in cross-section a sealing profile which does not necessarily have to be flat. The sealing body can have, for example, a round or rectangular sealing profile in cross-section at least in the region of the annular sealing section. For example, a sealing body with the line guide and the annular sealing section, which is connected therewith, with a round sealing profile would result in a special O-ring. The sealing body can preferably have two sealing sides which sealably contact the surfaces of the housing to be sealed.

The sealing body comprising the line guide and the annular sealing section can be of integral construction so as to provide a monolithic sealing body made from sealing material. A sealing body of that kind can be produced simply, in a few working steps and economically.

The sealing body is preferably in operative connection by an upper side and/or a lower side with a surface of the closure body and/or a surface of the housing in order to provide a seal. A mechanically positive connection is conceivable. As a result, large-area contact between the individual components is made possible, which has a particularly favorable influence on resistance of the housing to ingressing liquids such as water.

It is of advantage if the line guide has a line extension. In the case of arrangement of the sealing body at a housing, the extension can be arranged not only in an interior space of the housing, but also outside the housing. A combination is equally possible. The line extension makes it possible to lengthen the permeation path for water at the position of the line guide. A longer permeation path promotes a higher level of tightness.

For preference, a permanent connection is present between line and sealing body. In a preferred form of embodiment the line is vulcanized in place in the sealing material of the sealing body. The line enters into a connection with the sealing body at least in a section in the area of its stripped region. This connection is preferably formed adhesively; a cohesive connection is equally possible. Sealing body and line guide can be of integral construction. A permanent connection of that kind has the advantage that the sealing body and the line form a stable unit. The process of vulcanization in place is a known process able to be carried out in accordance with current industry standards, which increases process safety and simplifies quality control. In addition, the process is convenient and fast. On the one hand, known methods facilitate the procedure for approval and certification. On the other hand, it is possible to provide by this method a housing which fulfils the conditions at least for IP 68 according to DIN-EN 60529. Tests have shown that the housing tightness satisfies very high requirements.

In a preferred construction of the housing a structuring is provided in or at the sealing arrangement. The structuring can comprise an arrangement of beads or ribs. Additional thickenings of the sealing body are termed beads or ribs, these thickenings preferably being arranged to run around along the sealing body. The beads can in that case have, for example, a semicircular, sinusoidal or triangular cross-section. The structuring can be arranged at the housing base and/or closure body and/or at an upper side and/or lower side of the sealing body. The structuring can run around along the sealing body or along the housing. Complementary surfaces at all three components are equally possible. Such structurings increase local pressure and thus tightness. Equally, the surface can be increased which in turn results in a longer permeation path for the water.

The housing preferably comprises a measuring device for a measuring instrument, particularly for a water meter. A gas meter or an electricity meter is equally possible.

The invention further relates to a prefabricated sealing body for installation in a housing and for sealing the housing and particularly to a sealing body for the housing described in the preceding. The sealing body comprises a line guide for leading through one or more lines. Since the sealing body with line is prefabricated, it can be installed or incorporated in simple manner in a device to be sealed (for example, for sealing a housing for a measuring instrument such as, for example a water meter). The sealing body and the line or lines connected with the sealing body form a subassembly which can be simple to produce and mount and can be used for sealing a housing of a measuring instrument when required. The use of the described subassembly consisting of sealing body and line also has advantages with respect to productivity. Measuring instruments can be assembled in simple manner and with few working steps. The line can comprise one or more strands or wires (for example, of copper) and the strands or wires can have encasing insulations. Lines of that kind can be, for example, cables. The line has an electrical insulation, preferably an electrically insulating casing, as well as at least one line end. The line end of the line is at least partly stripped. A transition point from insulated line to deinsulated line end (or to the deinsulated line of the line end) is arranged in the line guide within the sealing body. Partly stripped means that the electrical insulation in a region of the line is completely removed. It is equally conceivable for the line end to be completely stripped. By prefabricated sealing body with line it is to be understood that the sealing body already consists of a whole component and as such can be introduced as a complete component into, for example, a housing for measuring instruments.

The arrangement of the transition point within the sealing body makes it possible for the line and the transition point to be completely surrounded by the sealing body. This makes it possible to produce a direct contact between line and sealing material and to thus achieve a particularly high level of sealing at the transition point.

Housings for measuring instruments can be of two-part or multi-part construction, wherein a sealing body is arranged between two housing halves or housing parts. Housings of that kind can have an encircling separation point, into which the sealing body is inserted, between the housing parts. The sealing body is consequently constructed in correspondence with the housing shape. The sealing body is preferably closed in itself. The sealing body can therefore be of annular form. The housings can have different cross-sections at the separation point thereof; as an example, mention may be made of round, oval and polygonal cross-sections, to which the shape of the sealing body is matched.

In order to increase the sealing effect, the line guide preferably has a line extension or a line extension on at least one side. In the case of arrangement of the sealing body at a housing with an interior space, the line extension can be arranged not only in the interior space of the housing, but also outside the housing. Instead of the combination of an inner and outer line extension, it is equally possible to provide a line extension on only one side, either only a line extension in the interior space or only a line extension directed outwardly. The line extension makes it possible to lengthen the permeation path for water in the region of the line guide. As permeation path there is meant the distance the liquid, predominantly water, has to cover due to physical effects such as, for example, diffusion or due to capillary effects, for example due to a gap, in the sealing body in order to be able to penetrate into the housing. A longer permeation path results from a line extension and an increased tightness in the region of the line guide results from that.

The line can preferably be permanently connected with the sealing body. With particular preference, the line is vulcanized in place and/or glued in the sealing material of the sealing body. Permanently means that the line in the region of its stripped region enters into a connection with the sealing body which ensures sealing over a lengthy period of time (advantageously several years). This connection is preferably adhesive; a cohesive connection is equally possible. Sealing body and line guide can be of integral construction. A permanent connection of that kind has the advantage that the sealing body and the line form a stable connection. The process of vulcanization is a known method which can be carried out in accordance with current industry standards, which increases process reliability and simplifies quality control. In addition, the method is convenient and rapid. Material outlay is reduced and service life extended due to the permanent connection of the sealing body and the line. For vulcanization, the line can be wetted or coated in the relevant area by an adhesion-promoting agent. The thus-prepared line can then be introduced into a casting mold. After a rubber mixture has been poured into the casting mold, the actual vulcanization step can be carried out.

Since the line is exposed to high temperatures during the vulcanization, it can be advantageous if the electrical insulation comprises a temperature-resistant material with a temperature resistance of at least 180° C. Use can be made of, for example, PTFE (polytetrafluoroethylene) as preferred temperature-resistant material. This enables production and manufacture of the sealing body without the insulation being damaged. An undesired melting of the insulation can thus be prevented. However, other materials are obviously also conceivable for the insulation. Such a material has the advantage that it can be integrated into the sealing material without problems in the production process of the sealing body.

Alternatively, the line can be glued into a sealing body preferably already produced in final state. This arrangement has the advantage that the line—by contrast to vulcanization in place—is not exposed to high temperatures, as a result of which less expensive lines with, for example, an electrical insulation of PVC (polyvinyl chloride) could also be used. It would also even be conceivable to use bare lines (i.e. lines without insulation) and to insulate the lines—after the line has been connected with the sealing body—by application to the line of, for example, an electrically insulating lacquer.

The line guide preferably has, by the line extension at the outer side and/or inner side, a dimension in longitudinal direction of the line which is at least 110%, preferably at least 150% and particularly preferably approximately 500%, of the dimension of the sealing body in the direction of the line guide. The line extension in the interior space (or the line guide at the inner side) advantageously has a greater dimension by comparison with the outwardly directed line extension. With particular advantage, the line extension at the inner side is at least twice as long as the line extension at the outer side. Sealing bodies of that kind typically have two sealing sides which can be brought into operative contact with surfaces, which are to be sealed off, of a housing, wherein these two sealing sides define therebetween a first spacing and an intermediate center plane. The line guide extends substantially along or parallel to this center plane. The sealing sides are connected together in such a way that they have a contour which is closed in cross-section and which is penetrated by the center plane at two penetration points. The spacing of the penetration points corresponds with the aforesaid dimension of the sealing body. The lines are thereby permanently connected with the sealing body over a larger and longer region. This increases the permeation path and promotes resistance to ingressing water or other media.

The length of the line guide along the line can preferably be several millimeters. Good results with respect to tightness can already be achieved with a line guide which is, for example, at least two millimeters long.

The transition point in the sealing body is preferably so arranged that the line is stripped to at least 20%, preferably 25 to 50% and particularly preferably approximately 75%, of the length of the line guide. This has the advantage that a direct connection with the sealing body can be entered into in the region of the deinsulation of the line.

The sealing body preferably comprises a material with a water vapor diffusion resistance greater than 10,000. The material is preferably a rubber-based material such as EPDM (ethylene propylene diene monomer (M class)), EPM (ethylene propylene M class) or butyl rubber or a blend of these materials. The water vapor diffusion resistance expresses how strongly a material prevents propagation or diffusion of water vapor. A high value of water vapor diffusion resistance, usually above 10,000, characterizes a particularly dense material and a particularly lengthy permeation path for water. Rubber-based materials are distinguished by a long service life, wear resistance and good vulcanization capability. In addition, they are weather-resistant. Through use of such a material a sealing body with a lengthy service life, which is usable in different weather conditions such as, for example, rain, ice and strong sunshine, is created.

The sealing body preferably has an inner side, wherein protruding abutment surfaces are arranged at the inner side in the region and preferably along the line guide. Abutment surfaces of that kind can be constructed as an eye or a projection. This makes it possible to create tension relief for the line in the region of the line guide, whereby the line and/or the sealing body is or are secured against being pulled out. The abutment surfaces can be formed integrally with the sealing body. This has the advantage that separate devices are not needed. The sealing body can be produced in one working step.

The sealing body preferably has an upper side and a lower side, which preferably have a structuring, particularly an arrangement of beads. A ribbing is equally conceivable. In that case, the structuring can be formed selectably only at the upper side or lower side or it can be present at both sides. Additional thickenings of the sealing material are termed beads and are preferably formed to encircle along the seal. The beads can in that case have a semicircular, sinusoidal or triangular cross-section. The stucturings have the advantage that local pressure and thus tightness when used in an appropriate housing are increased.

A further aspect of the invention relates to a method of producing a sealing body, as described in the foregoing, for installation in a housing, as described in the foregoing, and for sealing the housing, comprising the steps of:

providing a sealing body mold, removing the electrical insulation from at least a part of the line end, laying the at least one line in the mold so that this runs through the mold and the stripped line end is positioned at a transition point, and filling the mold.

The line is permanently connected with the sealing body during the preceding method steps or in an additional method step. The connection between line and sealing body can preferably be an adhesive connection. A cohesive connection would be equally possible.

The sealing body can be of integral construction. Integral construction of the sealing body has the advantage that it is favorable in cost, material consumption is less and method steps are reduced.

In a preferred example of the method the lines are vulcanized in place for connection with the sealing body. This has the advantage that a direct and very stable connection between line, particularly the stripped line, and sealing body can be produced and thus a high level of tightness is created.

The stripped line end is preferably treated with an adhesion-promoting agent prior to laying in the mold. Preferably a two-component adhesion promoter, for example ChemLok (Registered Trade Mark), Chemosil (Registered Trade Mark) or Parlock (Trade Mark), produced by the company Lord Corporation, is used. Adhesion-promoting agents are substances used for the purpose of improving the adhesive strength between different materials. They usually comprise different functional groups which can chemically react with the different material surfaces and thereby impart a very high level of strength and resistance to a connection of two different materials. ChemLok (Registered Trade Mark), Chemosil (Registered Trade Mark) and Parlock (Trade Mark) adhesion promotors are particularly suitable for connections of metals and rubber-based materials. Treatment with the adhesion promoter has the advantage that a high level of adhesion strength between line and sealing body is attained and resistance to corrosion, higher temperatures, oils and solvents between line end and sealing body is achieved.

A further aspect of the invention relates to a measuring instrument, particularly a water meter, with a housing as described in the preceding and sealing body as described in the preceding. Such measuring instruments are protected from external environmental influences and therefore can have a lengthy service life.

DESCRIPTION OF THE DRAWINGS

The invention is explained in more detail in the following by way of figures, which illustrate merely exemplifying embodiments and in which:

FIG. 1 shows a housing according to the invention for measuring instruments in a perspective illustration, FIG. 2 shows a housing of FIG. 1 in a sectional view, FIG. 3 shows a sealing body for the housing of FIG. 1 in a perspective illustration and FIG. 4 shows a detail of the sectional view of FIG. 2.

DETAILED DESCRIPTION

FIG. 1 shows a measuring instrument with a housing 100 according to the invention in a perspective illustration. The housing 100 comprises a sealing body 101, a closure body 1 and a housing base 2 with integrated measuring device 3 for the measuring instrument. In the present case the measuring instrument is, by way of example, a water meter. Water meters are volume measuring instruments for water to measure water quantity supplied by water mains. The measured quantity is represented by means of a mechanical roller counter and can be read off visually. The water meter illustrated in FIG. 1 comprises a mechanical roller counter with eight count wheels. Water meters of that kind have been known and customary for a lengthy period time. Water meters have become known from, for example, EP 0 502 306 A2. Modern water meters have an electronic determination of the counter state of the mechanical roller counter, whereby reading-out remotely is possible. For that purpose the water meter is network-wired; the respective cables or lines are denoted by 7a, 7b and 7c. It can be inferred from EP 0 660 264 B1 how the counter state could be read out. The present water meter is distinguished by a particularly effective and efficient sealing which satisfies high demands. The housing 100 described in detail in the following could, however, also be used in other fields of use.

The sealing body 101 is arranged in a recess or receptacle 4 of the housing base 2. The sealing body 101 can be inserted into the receptacle 4 formed by an encircling channel arranged at the upper side of the housing base (cf. FIG. 2 following). The plate-like closure body 1 can thereafter be placed on the sealing body, whereupon the closure body 1 is fixed in the housing by flanging-over the upper edge of the housing base 2. The pot-shaped housing base 2 in the present case is made of, for example, copper. However, the housing base could also consist of aluminum or steel, although plastics materials are also possible. The closure body 1 is made of, for example, glass or a transparent plastics material. Abutments 5 at the housing base 2, which co-operate with abutments at the sealing body 101 (not shown here), prevent unintended pulling-off or pushing-in of the sealing body 101 from or into the housing 100. The sealing body 101 has three line guides 6a, 6b and 6c for each leading through a respective line 7a, 7b or 7c.

FIG. 2 shows the housing 100 of FIG. 1 in a side view transversely through the housing 100 along a plane through the line 7b. The sealing body 101 in that case has a line extension 8b in the interior space 9 of the housing 100. The length L (FIG. 3) of the line extension 8b in the interior space 9 corresponds with approximately ten times the thickness dimension 10 of the sealing body 101. The sealing body 101 also has a line extension 8b' (FIG. 4) in outward direction, the length L' of which corresponds with approximately four times the thickness dimension 10 of the sealing body 101. A transition point 11 between a line 7b with insulation 12 (FIG. 4) and a stripped line end 13 is arranged in the sealing body 101. The line 7b is stripped up to the end of the line extension 8b. However, also only a part of the line 7b within the line extension 8b can be stripped. The sealing body 101 is arranged in a recess 4 of the housing base 2. Integrally formed regions, as holding-down devices 14, at the sealing body 101 fix the measuring device 3. The measuring device 3, here configured as a water meter, has count wheels 18. The holding-down devices are described in more detail in FIG. 3. The line extensions joined to the annular section of the sealing body on both sides are connected integrally with this sealing ring and form a monolithic sealing body. The housing base 2 is closed by the closure body 1. The flange edge, which is denoted by 20, at the upper edge of the housing base 2 can additionally be seen in FIG. 2, which flange edge is supported on the closure body and fixes this. The measuring device disposed in the interior of the housing comprises a circuitboard 19. The stripped line end 13 of the line 7b is soldered to the circuitboard 19 for the electrical connection. The electrical connection with the circuitboard could obviously also be carried out in a different way.

FIG. 3 shows an embodiment of the annular sealing body 101 according to the invention in a perspective illustration. For a square or triangular housing the sealing body is correspondingly redesigned. The sealing body 101 consists of EPDM material: however, the sealing body can also comprise different rubber-based materials such as EPM or butyl rubber and a blend of these materials (for example EPM peroxide) is equally possible. The line guides 6a, 6b, 6c for passage of the lines 7a, 7b, 7c extend through the sealing body 101 and have a line extension 8a, 8b, 8c. Line extensions 8b, 8b' (FIG. 4) are connected on both sides with the annular section with the dimension 10. The length L (cf. FIG. 4 following: length L is here $L_1+L_2$) of the line extensions 8a and 8c corresponds in length with ten times the thickness dimension 10 of the sealing body 101 and in width B with twice the thickness dimension 10 of the sealing body 101. The line extension 8b is somewhat shortened in length by comparison with 8a and 8c, but can also be formed to be of the same length. The line extensions 8a, 8b, 8c are directed into the interior of the sealing body 101. The lines 7a, 7b, 7c have an insulation 12, the line ends 13a, 13b, 13c of the lines 7a, 7b, 7c being stripped. The sealing body 101 is additionally constructed with holding-down devices 14. The holding-down devices 14 are, for example, integrally formed at the sealing body 101 at the time of a casting process for producing the sealing body 101. The holding-down devices 14 point in the direction of a center of the sealing body 101. They have a shape which is quadrilateral in cross-section, other polygonal shapes being equally conceivable. They have different lengths. They keep, as apparent from FIG. 2, the measuring instrument in the housing. The sealing body 101 has an upper side 15 and a lower side 16. The sealing body 101 has encircling beads 17 at the upper side 15.

As apparent from FIG. 3, the sealing body 101 has an annular sealing section 102 in order to form a closed sealing body. The line guides 6a, 6b, 6c with the lines 7a, 7b, 7c disposed therein are formed at the annular sealing section 102. The sealing body 101 with the line guides 6a, 6b, 6c and the annular sealing section 102 is of integral construction, whereby an advantageous monolithic sealing body made from a sealing material is present, which can be installed in simple manner between the housing base (not shown here) and closure body and—after assembly of the housing—can be arranged with sealing effect without a material couple and can, if necessary, be removed again from the housing without destruction.

FIG. 4 shows a detail of the sectional view of the sealing body 101 of FIG. 2 along the line 7b with a region of the line extension 8b. The sealing body 101 is permanently connected with the line 7b. The line 7b is vulcanized in place in the sealing material of the sealing body 101. A subassembly of sealing body 101 and lines 7a, 7b, 7c thereby arises. The lines are integrated in the sealing body 101 and fixedly connected therewith. This subassembly (see also FIG. 2) can be inserted in simple manner as a whole into the housing base. It is thus ensured that the housing can be assembled in simple manner and in a few steps. A transition point 11 between the line 7b with insulation 12 and stripped line end 13 is arranged within the sealing body 101. The sealing body 101 is arranged in a recess 4 of the housing base 2. At the upper side 15 and lower side 16 the sealing body 101 has stucturings 17, particularly an arrangement of beads. In the illustrated embodiment these beads are constructed to be sinusoidal in cross-section. A structuring which is semicircular or triangular in cross-section is equally possible. The beads nest against the closure body. In the illustration, the closure body 1 and sealing body 101 or the beads 17 of the sealing body 101 intersect. This is a simplified illustration of the actual relationships.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A housing for a measuring device, comprising:
   a housing base for retaining the measuring device;
   a closure body closing the housing base;
   a prefabricated sealing body, wherein the sealing body is sealingly arranged between the housing base and the closure body, wherein the sealing body includes at least one line guide for leading through a line, wherein the line has a portion with electrical insulation and a stripped line end without the electrical insulation, and wherein a transition point from the portion with electrical insulation to the stripped line end is arranged in the at least one line guide;
   wherein the sealing body has an annular sealing section forming a closed sealing body;
   wherein the sealing body together with the at least one line guide and the annular sealing section is of integral construction;
   wherein the at least one line guide has a line extension being at least one of directed inwardly from the annular sealing section into an interior space of the housing and directed outwardly from the annular sealing section; and
   wherein the line is connected with the sealing body by being vulcanized in a sealing material of the sealing body.

2. The housing according to claim 1 including the measuring device retained in the housing base and connected to the line to form a measuring instrument.

3. The housing according to claim 2 wherein the measuring instrument is a water meter.

4. A sealing body for installation in a housing and for sealing the housing, comprising:
   at least one line guide for leading through a line;
   the line having a portion with an electrical insulation, a stripped line end and a transition point from the portion with an electrical insulation to the stripped line end, the transition point being arranged in the at least one line guide within the sealing body, wherein the sealing body is prefabricated with the at least one line guide and the line prior to installation in the housing; and
   wherein the line is connected with the sealing body by being vulcanized in a sealing material of the sealing body.

5. The sealing body according to claim 4 wherein the sealing body has an annular sealing section forming a closed sealing body.

6. The sealing body according to claim 5 wherein the sealing body together with the at least one line guide and the annular sealing section is of integral construction.

7. The sealing body according to claim 4 wherein the at least one line guide has a line extension.

8. The sealing body according to claim 7 wherein the line extension is at least one of an inwardly directed line extension and an outwardly directed line extension and wherein the inwardly directed line extension has a greater length than the outwardly directed line extension when the line extension includes both the inwardly directed line extension and the outwardly directed line extension.

9. The sealing body according to claim 7 wherein the at least one line guide together with the line extension has a length in a longitudinal direction that is at least 110% of a thickness dimension of the sealing body.

10. The sealing body according to claim 7 wherein the at least one line guide line has a length in a longitudinal direction of at least 1 millimeter.

11. The sealing body according to claim 7 wherein the transition point is arranged in the at least one line guide such that a length of a portion of the stripped line end in the at least one line guide is between 20% and 75% of a length of the at least one line guide.

12. The sealing body according to claim 4 wherein the electrical insulation is a temperature-resistant material with a temperature resistance of at least 180° C.

13. The sealing body according to claim 4 wherein the sealing body is formed from a material with a water vapor diffusion resistance greater than 10,000.

14. The sealing body according to claim 4 wherein the sealing body has an upper side and a lower side and at least one of the upper side and the lower side has a structuring formed therein.

15. A housing for a measuring device, comprising:
   a pot-shaped housing base having an interior space adapted for retaining the measuring device below an upper edge of the housing base;
   a closure body closing the housing base at the upper edge; and
   a prefabricated sealing body, wherein the sealing body is sealingly arranged between the housing base and the closure body, wherein the sealing body includes at least one line guide for leading through a line, wherein the line has a portion with electrical insulation and a stripped line end without the electrical insulation, and wherein a transition point from the portion with electrical insulation to the stripped line end is arranged in the at least one line guide;
   wherein the sealing body has an annular sealing section forming a closed sealing body;
   wherein the sealing body together with the at least one line guide and the annular sealing section is of integral construction;
   wherein the at least one line guide of the sealing body has a line extension directed inwardly from the annular sealing section into interior space of the housing; and
   wherein the line is connected with the sealing body by being vulcanized in a sealing material of the sealing body.

* * * * *